(12) United States Patent
Cho et al.

(10) Patent No.: US 10,381,461 B2
(45) Date of Patent: Aug. 13, 2019

(54) METHOD OF FORMING A SEMICONDUCTOR DEVICE WITH AN INJECTOR HAVING FIRST AND SECOND OUTLETS

(71) Applicant: SAMSUNG ELECTRONICS CO., LTD., Suwon-si, Gyeonggi-Do (KR)

(72) Inventors: Namjin Cho, Hwaseong-si (KR); Yeontae Kim, Suwon-si (KR); Keesoo Park, Hwaseong-si (KR); Eunsok Choi, Uiwang-si (KR); Kyuhee Han, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 63 days.

(21) Appl. No.: 15/649,996

(22) Filed: Jul. 14, 2017

(65) Prior Publication Data

US 2017/0317188 A1    Nov. 2, 2017

Related U.S. Application Data

(62) Division of application No. 14/976,320, filed on Dec. 21, 2015, now abandoned.

(30) Foreign Application Priority Data

Jul. 7, 2015    (KR) .................. 10-2015-0096707

(51) Int. Cl.
*C23C 16/455*    (2006.01)
*H01L 29/66*    (2006.01)

(52) U.S. Cl.
CPC ...... *H01L 29/66742* (2013.01); *C23C 16/455* (2013.01); *C23C 16/45519* (2013.01); *C23C 16/45563* (2013.01); *C23C 16/45574* (2013.01)

(58) Field of Classification Search
CPC ............ C23C 16/455; C23C 16/45563; C23C 16/45576; C23C 16/4584; C23C 16/45584
See application file for complete search history.

(56) References Cited

U.S. PATENT DOCUMENTS 4,438,183 A * 3/1984 Baughman .............. C25B 1/003
                                                          204/290.01
5,244,501 A    9/1993 Nakayama et al.
(Continued)

FOREIGN PATENT DOCUMENTS

CN    102239543    11/2011
DE    19937513 A1 * 3/2001
(Continued)

OTHER PUBLICATIONS

Ciorga, M., et al., "Electrical spin injection and detection in lateral all-semiconductor devices". Physical Review B 79, 165321 (2009), pp. 1-6.*

(Continued)

*Primary Examiner* — Bret P Chen
(74) *Attorney, Agent, or Firm* — F. Chau & Associates, LLC (57) ABSTRACT

A method of forming a semiconductor device includes: loading a wafer onto a susceptor, wherein the susceptor is disposed inside a chamber; heating the inside of the chamber; and rotating the susceptor, and first forming a film on the wafer by outputting a reactive gas and a carrier gas from an injector disposed at a sidewall of the chamber to form a semiconductor device having a first layer, wherein the first layer is manufactured under a first condition, wherein the injector includes a first outlet exposed within the chamber to discharge the carrier gas directly into the chamber and a second outlet exposed within the chamber to discharge the
(Continued)

reactive gas directly into the chamber, wherein the first outlet is disposed below the second outlet.

7 Claims, 8 Drawing Sheets

(56) References Cited

U.S. PATENT DOCUMENTS

| | | | |
|---|---|---|---|
| 5,413,967 A * | 5/1995 | Matsuda | H01L 21/02131 |
| | | | 148/DIG. 118 |
| 5,453,124 A * | 9/1995 | Moslehi | C23C 16/45561 |
| | | | 118/715 |
| 5,551,985 A | 9/1996 | Brors et al. | |
| 5,916,369 A * | 6/1999 | Anderson | C23C 16/455 |
| | | | 118/715 |
| 6,068,016 A | 5/2000 | Manofsky, Jr. et al. | |
| 6,572,707 B1 | 6/2003 | Nguyen | |
| 8,486,191 B2 | 7/2013 | Aggarwal et al. | |
| 8,608,383 B2 | 12/2013 | Tseng et al. | |
| 8,608,853 B2 | 12/2013 | Tseng et al. | |
| 2002/0094600 A1 * | 7/2002 | Aburatani | C23C 16/4584 |
| | | | 438/100 |
| 2002/0173164 A1 | 11/2002 | Raffin et al. | |
| 2007/0087533 A1 | 4/2007 | Nishikawa et al. | |
| 2007/0292612 A1 * | 12/2007 | Ueno | C23C 16/4482 |
| | | | 427/248.1 |
| 2008/0178810 A1 | 7/2008 | Koizumi et al. | |
| 2008/0318431 A1 | 12/2008 | Ohmi et al. | |
| 2009/0275183 A1 * | 11/2009 | Mine | H01L 21/76224 |
| | | | 438/287 |
| 2009/0291211 A1 | 11/2009 | Ryu et al. | |
| 2010/0272892 A1 | 10/2010 | Kobayashi et al. | |
| 2010/0291763 A1 * | 11/2010 | Ogawa | C23C 16/405 |
| | | | 438/584 |
| 2011/0003482 A1 * | 1/2011 | Ogawa | C23C 16/303 |
| | | | 438/763 |
| 2011/0067632 A1 | 3/2011 | Poppe et al. | |
| 2011/0186226 A1 | 8/2011 | Sudou et al. | |
| 2012/0263877 A1 | 10/2012 | Strauch et al. | |
| 2013/0125819 A1 | 5/2013 | Borean et al. | |
| 2013/0180454 A1 | 7/2013 | Park et al. | |
| 2014/0137801 A1 | 5/2014 | Lau et al. | |
| 2016/0068956 A1 | 3/2016 | Lau et al. | |
| 2017/0011904 A1 | 1/2017 | Cho et al. | |

FOREIGN PATENT DOCUMENTS

| | | |
|---|---|---|
| JP | 2003-201565 | 7/2003 |
| JP | 2013/201565 | 7/2003 |
| KR | 1020020088621 | 11/2002 |
| KR | 1020100101829 | 9/2010 |
| KR | 1020120029797 | 3/2012 |
| WO | WO 2009/085992 A2 * | 7/2009 |
| WO | WO 2010/054184 A3 * | 5/2010 |

OTHER PUBLICATIONS

U.S. Office Action dated Nov. 10, 2016 in corresponding U.S. Appl. No. 14/976,320.
U.S. Final Office Action dated May 5, 2017 in corresponding U.S. Appl. No. 14/976,320.
Chinese Office Action issued in corresponding application No. 201610256448.9 dated Nov. 27, 2018.

* cited by examiner

METHOD OF FORMING A SEMICONDUCTOR DEVICE WITH AN INJECTOR HAVING FIRST AND SECOND OUTLETS

CROSS-REFERENCE TO RELATED APPLICATIONS

This application is a divisional of U.S. patent application Ser. No. 14/976,320, filed on Dec. 21, 2015, which claims priority under 35 U.S.C. § 119 to Korean Patent Application No. 10-2015-0096707 filed on Jul. 7, 2015, the disclosures of which are incorporated by reference herein in their entireties.

TECHNICAL FIELD

Exemplary embodiments of the inventive concept relate to an injector, a film forming apparatus having the injector, and a method of operating the film forming apparatus.

DESCRIPTION OF RELATED ART

In general, when forming a thin film on a semiconductor substrate, the semiconductor substrate is loaded into a chamber, a reactive gas is supplied onto the semiconductor substrate, a thin film is formed on the semiconductor substrate, and then, the reactive gas and by-products are discharged from the chamber. However, when the reactive gas has an asymmetrical flow, a thickness of the thin film may not be uniform.

SUMMARY

Exemplary embodiments of the inventive concept provide a film forming apparatus for uniformly forming a thin film.

Exemplary embodiments of the inventive concept provide a method of operating the film forming apparatus for uniformly forming a thin film.

In accordance with an exemplary embodiment of the inventive concept, a thin film forming apparatus comprises: an injector, the injector including: a distributor including a first distribution portion connected to a first gas inlet, and a second distribution portion connected to a second gas inlet; and a guide connected to the distributor, the guide including a first outlet connected to the first distribution portion, and a second outlet connected to the second distribution portion, wherein the second outlet is disposed above the first outlet.

Each of the first distribution portion, and the second distribution portion may include a plurality of holes.

The distributor may include a third distribution portion connected to a third gas inlet, and the guide may include a third outlet connected to the third distribution portion, wherein the third outlet is disposed above the second outlet.

The apparatus may further comprise: a reactive gas source; a reactive gas controller connected to the reactive gas source; a reactive gas valve connected to the reactive gas controller; and an inlet valve connected between the reactive gas valve and the second gas inlet.

The apparatus may further comprise: a carrier gas source; a carrier gas controller connected to the carrier gas source; and a carrier gas valve connected between the carrier gas controller and the first gas inlet.

In accordance with an exemplary embodiment of the inventive concept, a thin film forming apparatus comprises: a chamber, the chamber including: an entrance; a susceptor configured to receive a substrate provided via the entrance; an exit through which a byproduct resulting from a process leaves the chamber; and a first injector disposed in the chamber, the first injector including: a first outlet configured to provide a carrier gas to the substrate; and a second outlet configured to provide a reactive gas to the substrate, wherein the first outlet and the second outlet are alternately arranged in a direction that is perpendicular to the substrate.

The first outlet may be closer to the substrate than the second outlet.

The first chamber may be disposed opposite the exit.

The apparatus may further comprise: a carrier gas source connected to the first outlet; and a reactive gas source connected to the second outlet.

The chamber may include: a second injector including: a first outlet configured to provide the carrier gas to the substrate; and a second outlet configured to provide the reactive gas to the substrate, wherein the first outlet and the second outlet are alternately arranged in the direction that is perpendicular to the substrate.

The second injector may be disposed at a corner where two sidewalls of the chamber meet.

The chamber may include: a third injector including: a first outlet configured to provide the carrier gas to the substrate; and a second outlet configured to provide the reactive gas to the substrate, wherein the first outlet and the second outlet are alternately arranged in the direction that is perpendicular to the substrate.

The third injector may be disposed at a sidewall of the chamber.

In accordance with an exemplary embodiment of the inventive concept, a method of forming a semiconductor device comprises: loading a wafer onto a susceptor, wherein the susceptor is disposed inside a chamber; heating the inside of the chamber; and rotating the susceptor, and first forming a film on the wafer by outputting a reactive gas and a carrier gas from an injector disposed at a sidewall of the chamber to form a semiconductor device having a first layer, wherein the first layer is manufactured under a first condition, wherein the injector includes a first outlet to output the carrier gas and a second outlet to output the reactive gas, wherein the first outlet is disposed below the second outlet.

The first layer of the semiconductor device may form a source or a drain.

The carrier gas may include H2 and the reactive gas may include at least one of DCS, HCl, GeH4 and B2H6.

The method may further comprise: changing the first condition to a second condition, rotating the susceptor, and second forming the film by outputting the reactive gas and the carrier gas using the injector to form a second layer of the semiconductor device.

The method may further comprise: changing the second condition to a third condition, rotating the susceptor, and third forming the film using the reactive gas and the carrier gas using the injector to form a third layer of the semiconductor device; removing the wafer from the chamber; and cleaning the chamber.

A flow rate of the reactive gas in the first forming may be different from a flow rate of the reactive gas in the second forming.

The first to third conditions may include pressure and temperature.

BRIEF DESCRIPTION OF THE DRAWINGS

The above other features of the inventive concept will become more apparent by describing in detail exemplary embodiments thereof with reference to the accompanying drawings in which.

DETAILED DESCRIPTION OF THE EMBODIMENTS

The inventive concept will now be described more fully hereinafter with reference to the accompanying drawings, in which exemplary embodiments thereof are shown. The inventive concept may, however, be embodied in many different forms and should not be construed as being limited to the embodiments set forth herein.

As used herein, the singular forms "a," "an," and "the" are intended to include the plural forms as well, unless the context clearly indicates otherwise.

When one element (elements) is (are) referred to as "connected" or "coupled" to other element(s), this may indicate directly connected or coupled to the element(s), or intervening element(s) may be present. Throughout the specification, the same reference numbers may refer to the same components.

Figure 1:
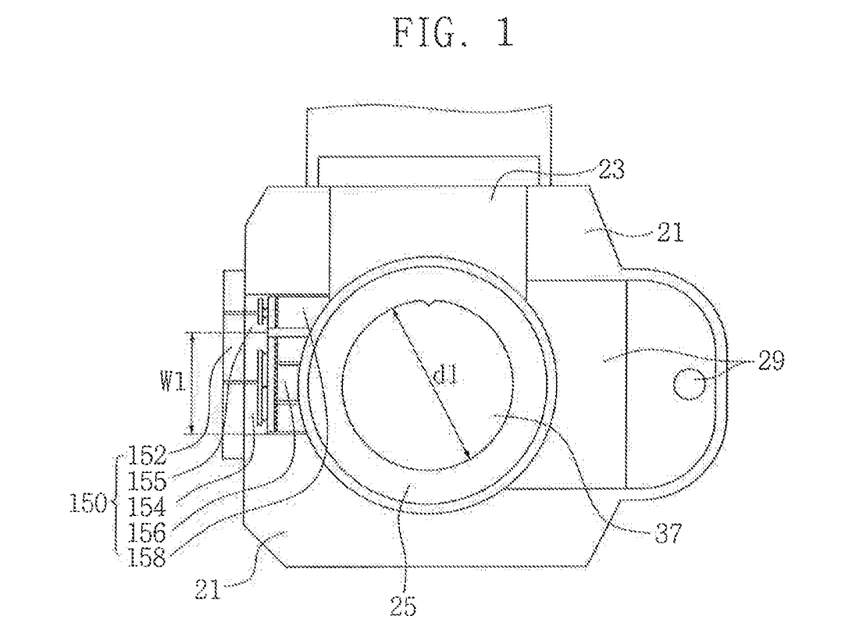
FIG. 1 is a schematic layout of a film forming apparatus according to an exemplary embodiment of the inventive concept.

FIG. 1 is a schematic layout of a film forming apparatus according to an exemplary embodiment of the inventive concept. The film forming apparatus according to the present embodiment of the inventive concept may be an apparatus used for an epitaxial growth process.

Referring to FIG. 1, the film forming apparatus may include a chamber 21, an entrance 23, a susceptor 25, an injector 150, and an outlet 29. A substrate 37 may be loaded on the susceptor 25 through the entrance 23. The injector 150 may include a body 152, a first distributor 154, a second distributor 155, a first guide 156, and a second guide 158.

The entrance 23, the injector 150, and the outlet 29 may each be disposed on a sidewall of the chamber 21 and separated from each other. The outlet 29 may face the injector 150. For example, the outlet 29 may be disposed opposite to the injector 150. The susceptor 25 may be disposed inside the chamber 21 between the injector 150 and the outlet 29. The substrate 37 may be loaded on and unloaded from the susceptor 25 through the entrance 23. The substrate 37 may be a semiconductor substrate such as a silicon wafer or silicon on insulator (SOI) wafer.

The body 152 may be mounted on a sidewall of the chamber 21. The first guide 156 and the second guide 158 may be exposed inside the chamber 21. The second guide 158 may be attached on a side surface of the first guide 156. The second guide 158 may be disposed between the first guide 156 and the entrance 23. A horizontal width W1 of the first guide 156 may be about 0.5 to about 1 times a diameter d1 of the substrate 37. The first distributor 154 may be disposed between the first guide 156 and the body 152. The second distributor 155 may be disposed between the second guide 158 and the body 152. The second distributor 155 may be attached on a side surface of the first distributor 154. The second distributor 155 may be disposed between the first distributor 154 and the entrance 23.

In an exemplary embodiment of the inventive concept, a second injector 150 may be disposed in the chamber 21. For example, the second injector 150 may be disposed at a corner where two sidewalls of the chamber 21 meet. In an exemplary embodiment of the inventive concept, a third injector 150 may be disposed in the chamber 21. For example, when the first injector 150 is disposed at a first sidewall of the chamber 21 opposite the outlet 29 and the second injector 150 is disposed at an area where the first sidewall and a second sidewall of the chamber 21 meet, the third injector 150 may be disposed at the second sidewall of the chamber 21.

Figure 2:
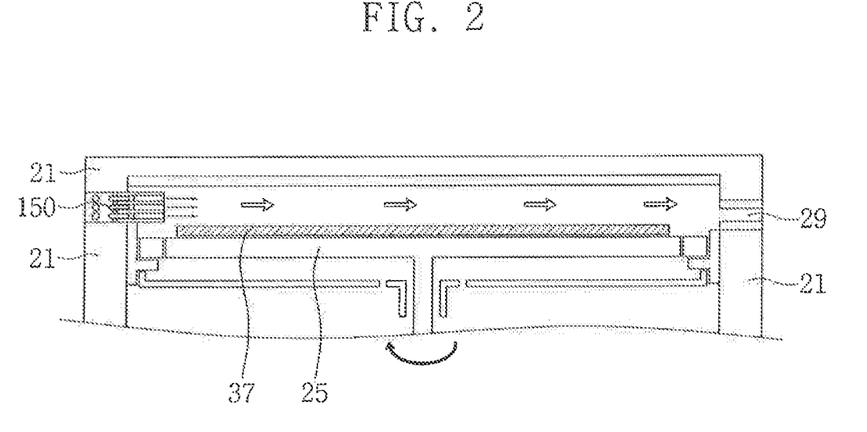
FIG. 2 is a cross-sectional view of the film forming apparatus of FIG. 1 according to an exemplary embodiment of the inventive concept.

FIG. 2 is a cross-sectional view of the film forming apparatus of FIG. 1 according to an exemplary embodiment of the inventive concept.

Referring to FIG. 2, the injector 150 may be mounted on a sidewall of the chamber 21. The outlet 29 may be formed on another sidewall of the chamber 21. The susceptor 25 may be disposed inside the chamber 21. The substrate 37 may be loaded on the susceptor 25. The susceptor 25 may rotate the substrate 37. For example, the rotation direction of the substrate 37 is indicated by the arrow shown in FIG. 2. The injector 150 may be parallel to a surface of the substrate 37. A heater may be disposed inside or under the susceptor 25 to heat the substrate 37 and the inside of the chamber 21. For example, the inside of the chamber 21 may be heated to a temperature of 1000° C. or more.

Figure 3:
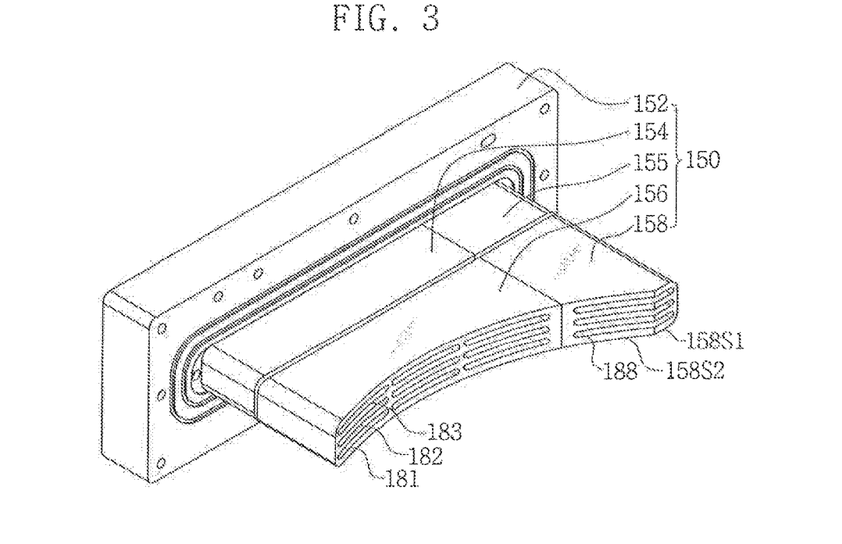
FIG. 3 is a perspective view of an injector according to an exemplary embodiment of the inventive concept.
Figure 4:
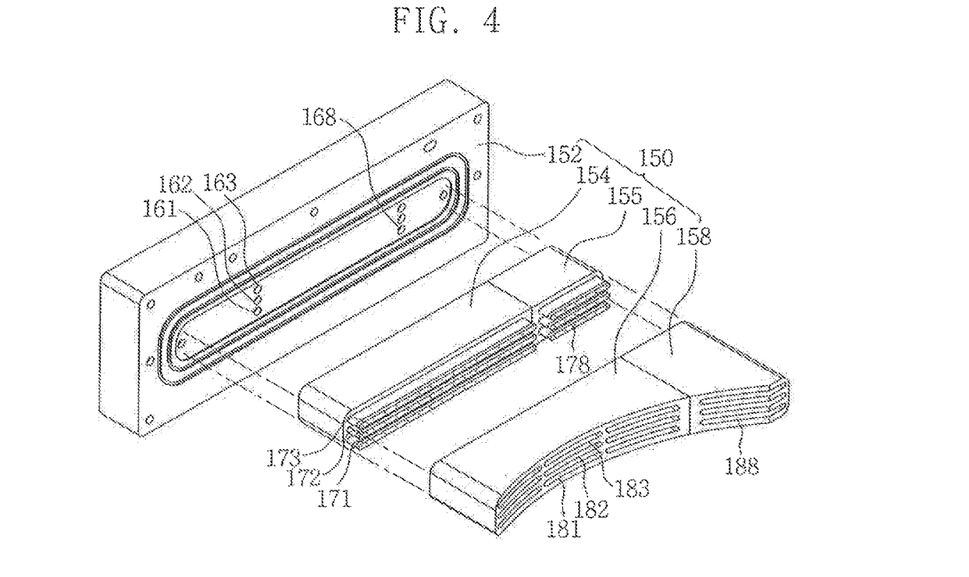
FIG. 4 is an exploded view of FIG. 3, according to an exemplary embodiment of the inventive concept.

FIG. 3 is a perspective view of an injector according to an exemplary embodiment of the inventive concept, and FIG. 4 is an exploded view of FIG. 3, according to an exemplary embodiment of the inventive concept.

Referring to FIGS. 3 and 4, the injector 150 may include a body 152, a first distributor 154, a second distributor 155, a first guide 156, and a second guide 158. The body 152 may include a first gas inlet 161, a second gas inlet 162, a third gas inlet 163, and a curtain gas inlet 168. The first distributor 154 may include a first layer distributor 171, a second layer distributor 172, and a third layer distributor 173. The second distributor 155 may include a curtain gas distributor 178. The first guide 156 may include a first layer outlet 181, a second layer outlet 182, and a third layer outlet 183. The second guide 158 may include a curtain gas outlet 188.

The first distributor 154 and the second distributor 155 may be mounted on the body 152. The first guide 156 may be coupled with the first distributor 154, and the second guide 158 may be coupled with the second distributor 155. The body 152 may include a metal such as stainless steel (SUS). The first distributor 154 and the second distributor 155 may include a material such as SUS, ceramic, or heat-resistant plastic which is not deformed at a high temperature. The first guide 156 and the second guide 158 may include quartz.

Each of the first layer outlet 181, the second layer outlet 182, the third layer outlet 183, and the curtain gas outlet 188 may include a plurality of holes, one or more slits, or a combination thereof. Each of the first layer distributor 171, the second layer distributor 172, the third layer distributor 173, and the curtain gas distributor 178 may include a plurality of holes, one or more slits, or a combination thereof.

One surface of the first guide 156 may have substantially the same curvature as inner walls of the chamber 21. The first layer outlet 181 may have a greater horizontal width than a height. A horizontal width of the first layer outlet 181 may be about 0.5 to about 1 times the diameter dl of the substrate 37. The first layer outlet 181 may be parallel to the surface of the substrate 37. The first layer outlet 181 may be in communication with the first gas inlet 161 through the first layer distributor 171.

The second layer outlet 182 may have a greater horizontal width than a height. A horizontal width of the second layer outlet 182 may be about 0.5 to about 1 times the diameter dl of the substrate 37. The second layer outlet 182 may be parallel to the surface of the substrate 37. The second layer outlet 182 may be in communication with the second gas inlet 162 through the second layer distributor 172. The second layer outlet 182 may be formed at a higher level than the first layer outlet 181. In other words, the second layer outlet 182 may be formed above the first layer outlet 181.

The third layer outlet 183 may have a greater horizontal width than a height. A horizontal width of the third layer outlet 183 may be about 0.5 to about 1 times the diameter dl of the substrate 37. The third layer outlet 183 may be parallel to the surface of the substrate 37. The third layer outlet 183 may be in communication with the third gas inlet 163 through the third layer distributor 173. The third layer outlet 183 may be formed at a higher level than the second layer outlet 182. In other words, the third layer outlet 183 may be formed above the second layer outlet 182.

The second guide 158 may include a first surface 158S1 and a second surface 158S2 in contact with the first surface 158S1. The first surface 158S1 of the second guide 158 may be substantially coplanar with a plane extending from the entrance 23. The second surface 158S2 of the second guide 158 may have substantially the same curvature as inner walls of the chamber 21. The curtain gas outlet 188 may be in communication with the curtain gas inlet 168 through the curtain gas distributor 178.

Figure 5:
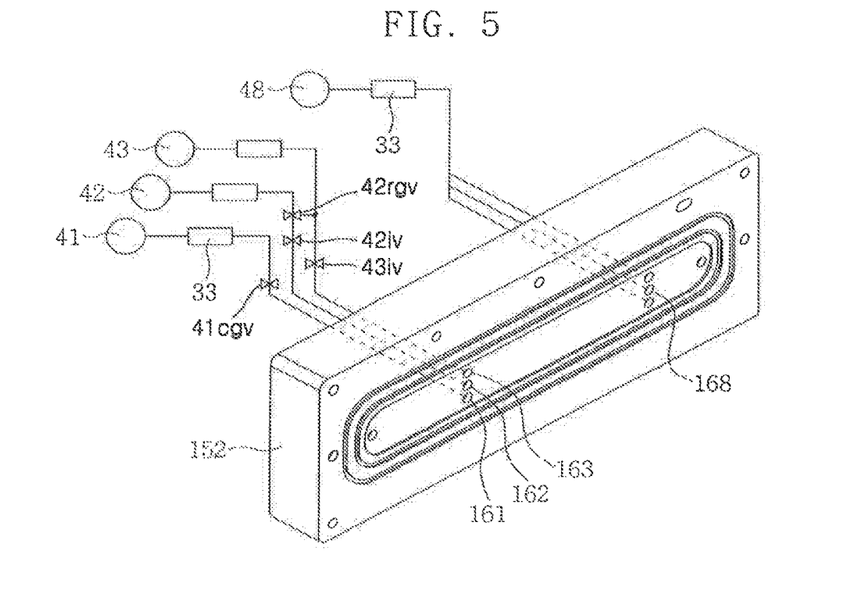
FIG. 5 is a perspective view of a film forming apparatus according to an exemplary embodiment of the inventive concept.

FIG. 5 is a perspective view of a film forming apparatus according to an exemplary embodiment of the inventive concept.

Referring to FIG. 5, a body 152 may include a first gas inlet 161, a second gas inlet 162, a third gas inlet 163, and a curtain gas inlet 168. The body 152 may be connected to first to third gas supply devices 41, 42, and 43 and a curtain gas supply device 48. A controller 33, such as a mass flow controller (MFC) or flow ratio controller (FRC), may be mounted between the body 152 and the first to third gas supply devices 41, 42, and 43 and between the body 152 and the curtain gas supply device 48.

The first gas inlet 161 may be connected to the first gas supply device 41 through the controller 33. The second gas inlet 162 may be connected to the second gas supply device 42 through the controller 33. The third gas inlet 163 may be connected to the third gas supply device 43 through the controller 33. The curtain gas inlet 168 may be connected to the curtain gas supply device 48 through the controller 33.

The first gas supply device 41 may supply a first carrier gas to the first gas inlet 161, the second gas supply device 42 may supply a first reactive gas to the second gas inlet 162, and the third gas supply device 43 may supply a second reactive gas to the third gas inlet 163. The curtain gas supply device 48 may supply an inert gas to the curtain gas inlet 168.

In an exemplary embodiment of the inventive concept, the curtain gas supply device 48 may supply the first carrier gas to the curtain gas inlet 168. In an exemplary embodiment of the inventive concept, the third gas supply device 43 may supply a second carrier gas to the third gas inlet 163.

Figure 6:
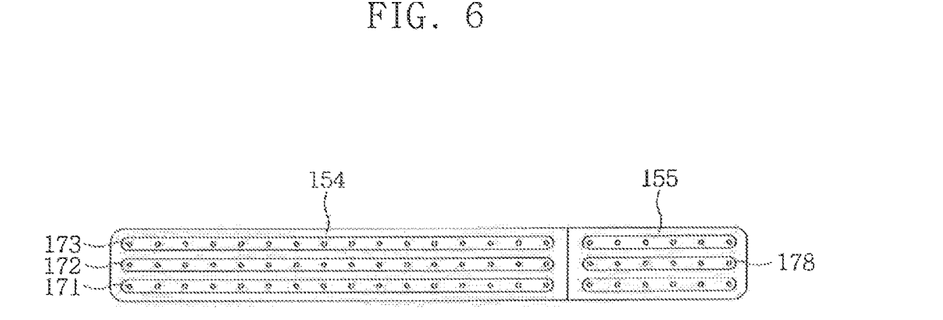
FIG. 6 is a detailed view showing a part of FIG. 4 from a different angle, according to an exemplary embodiment of the inventive concept.

FIG. 6 is a detailed view showing a part of FIG. 4 from a different angle, according to an exemplary embodiment of the inventive concept.

Referring to FIG. 6, the first distributor 154 may include the first layer distributor 171, the second layer distributor 172, and the third layer distributor 173. The second distributor 155 may include the curtain gas distributor 178.

The first distributor 154 may have a greater horizontal width than a height. Each of the first layer distributor 171, the second layer distributor 172, and the third layer distributor 173 may have a greater horizontal width than a height. Each of the first layer distributor 171, the second layer distributor 172, and the third layer distributor 173 may include a plurality of holes. The second layer distributor 172 and the third layer distributor 173 may be sequentially stacked on the first layer distributor 171. The first layer distributor 171 may have substantially the same horizontal width as the second layer distributor 172 and the third layer distributor 173.

In an exemplary embodiment of the inventive concept, the first layer distributor 171 may have a greater horizontal width than the second layer distributor 172 or the third layer distributor 173.

In an exemplary embodiment of the inventive concept, each of the first layer distributor 171, the second layer distributor 172, and the third layer distributor 173 may include one or more slits, a plurality of holes, or a combination thereof.

Referring again to FIGS. 1 to 6, the first gas supply device 41 may supply the first carrier gas into the chamber 21 through the controller 33, the first gas inlet 161, the first layer distributor 171, and the first layer outlet 181. The second gas supply device 42 may supply the first reactive gas into the chamber 21 through the controller 33, the second gas inlet 162, the second layer distributor 172, and the second layer outlet 182. The third gas supply device 43 may supply the second reactive gas into the chamber 21 through the controller 33, the third gas inlet 163, the third layer distributor 173, and the third layer outlet 183. The curtain gas supply device 48 may supply the inert gas into the chamber 21 through the controller 33, the curtain gas inlet 168, the curtain gas distributor 178, and the curtain gas outlet 188.

In an exemplary embodiment of the inventive concept, the second gas supply device 42 may be a second reactive gas source. The controller 33, which is connected to the second reactive gas source, may include a second reactive gas controller. A reactive gas valve may be connected to the second reactive gas controller. A second inlet valve may be connected between the reactive gas valve and the second gas inlet 162.

In an exemplary embodiment of the inventive concept, the third gas supply device 43 may be a third reactive gas source. The controller 33, which is connected to the third reactive gas source, may include a third reactive gas controller. The reactive gas valve connected to the second reactive gas controller may also be connected to the third reactive gas controller. A third inlet valve may be connected between the reactive gas value and the third gas inlet 163.

In an exemplary embodiment of the inventive concept, the first gas supply device 41 may be a carrier gas source. The controller 33, which is connected to the carrier gas source, may include a carrier gas controller. A carrier gas valve may be connected between the carrier gas controller and the first gas inlet 161.

In an exemplary embodiment of the inventive concept, the curtain gas supply device 48 may supply the first carrier gas into the chamber 21. In an exemplary embodiment of the inventive concept, the third gas supply device 43 may supply the second carrier gas into the chamber 21.

The first carrier gas, the second carrier gas, and the inert gas may each include a material which does not react or is difficult to react with the first reactive gas and the second reactive gas. The second reactive gas may include a material different from the first reactive gas.

Figure 7:
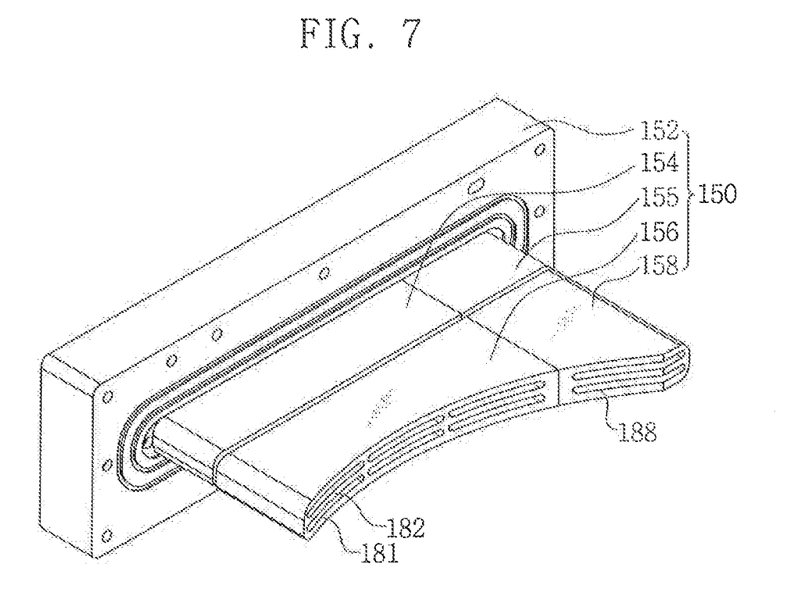
FIG. 7 is a perspective view of an injector according to an exemplary embodiment of the inventive concept.
Figure 8:
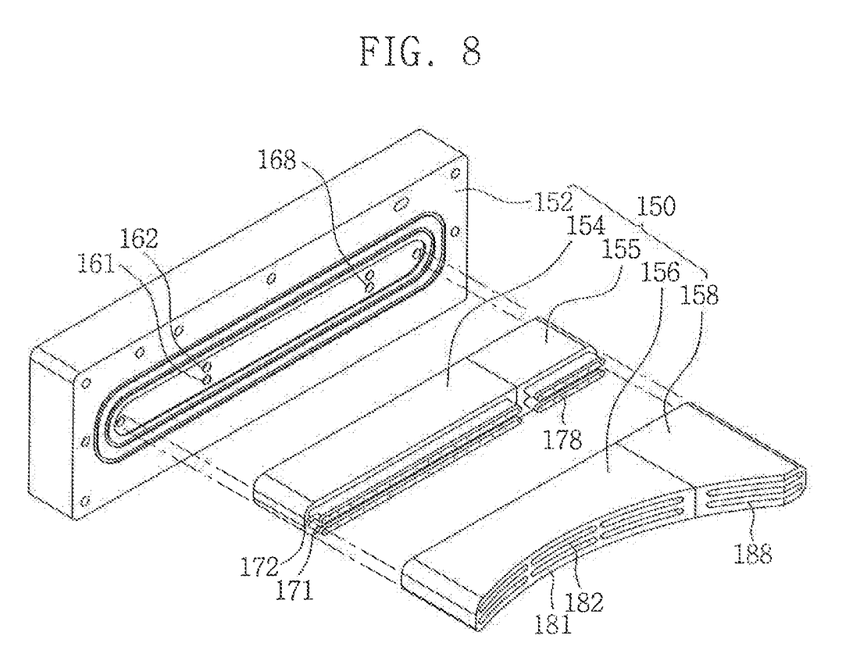
FIG. 8 is an exploded view of FIG. 7, according to an exemplary embodiment of the inventive concept.

FIG. 7 is a perspective view for describing an injector according to an exemplary embodiment of the inventive concept, and FIG. 8 is an exploded view of FIG. 7, according to an exemplary embodiment of the inventive concept.

Referring to FIGS. 7 and 8, an injector 150 may include a body 152, a first distributor 154, a second distributor 155, a first guide 156, and a second guide 158. The body 152 may include a first gas inlet 161, a second gas inlet 162, and a curtain gas inlet 168.

The first distributor 154 may include a first layer distributor 171 and second layer distributor 172. The second distributor 155 may include a curtain gas distributor 178. The first guide 156 may include a first layer outlet 181 and a second layer outlet 182. The second guide 158 may include a curtain gas outlet 188.

The first layer outlet 181 may discharge a first carrier gas into the chamber 21. The second layer outlet 182 may discharge a first reactive gas into the chamber 21.

Figure 9:
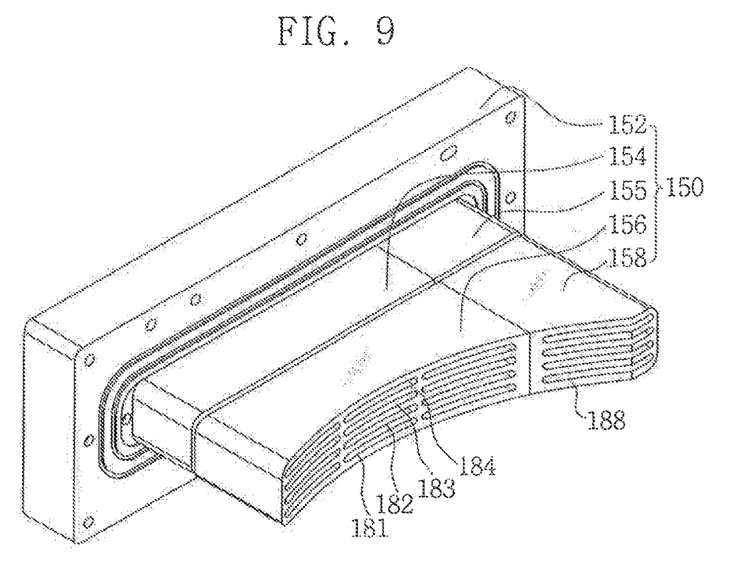
FIG. 9 is a perspective view of an injector according to an exemplary embodiment of the inventive concept.
Figure 10:
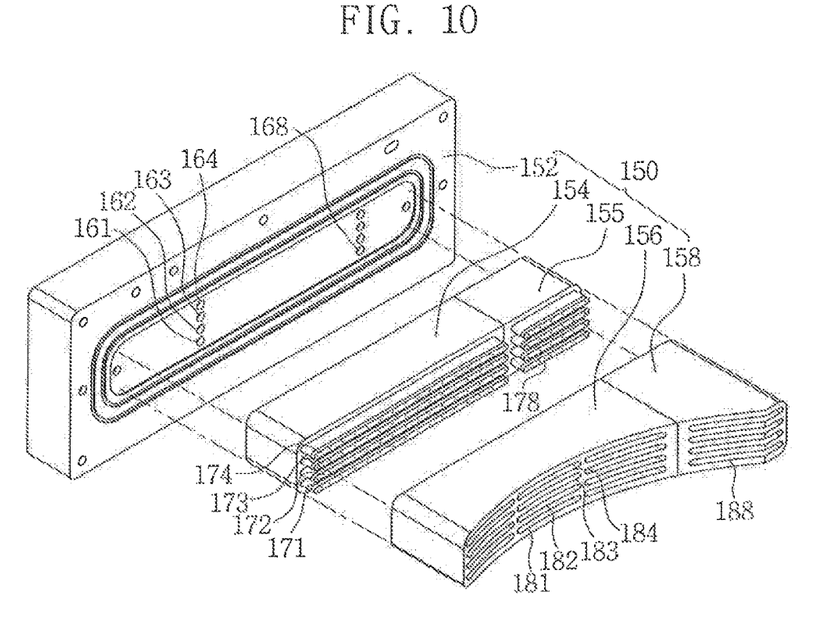
FIG. 10 is an exploded view of FIG. 9, according to an exemplary embodiment of the inventive concept.

FIG. 9 is a perspective view of an injector according to an exemplary embodiment of the inventive concept, and FIG. 10 is an exploded view of FIG. 9, according to an exemplary embodiment of the inventive concept.

Referring to FIGS. 9 and 10, an injector 150 may include a body 152, a first distributor 154, a second distributor 155, a first guide 156, and a second guide 158. The body 152 may include a first gas inlet 161, a second gas inlet 162, a third gas inlet 163, a fourth gas inlet 164, and a curtain gas inlet 168.

The first distributor 154 may include a first layer distributor 171, a second layer distributor 172, a third layer distributor 173, and a fourth layer distributor 174. The second distributor 155 may include a curtain gas distributor 178. The first guide 156 may include a first layer outlet 181, a second layer outlet 182, a third layer outlet 183, and a fourth layer outlet 184. The fourth layer outlet 184 may be formed at a higher level than the third layer outlet 183. In other words, the fourth layer outlet 184 may be formed above the third layer outlet 183. The fourth layer outlet 184 may be in communication with the fourth gas inlet 164 through the fourth layer distributor 174. The second guide 158 may include a curtain gas outlet 188.

The first layer outlet 181 may discharge a first carrier gas into the chamber 21. The second layer outlet 182 may discharge a first reactive gas into the chamber 21. The third layer outlet 183 may discharge a second carrier gas into the chamber 21. The fourth layer outlet 184 may discharge a second reactive gas into the chamber 21.

In an exemplary embodiment of the inventive concept, the first layer outlet 181 may discharge the first carrier gas into the chamber 21. The second layer outlet 182 may discharge the first reactive gas into the chamber 21. The third layer outlet 183 may discharge the second reactive gas into the chamber 21. The fourth layer outlet 184 may discharge a third reactive gas into the chamber 21.

In an exemplary embodiment of the inventive concept, one or more outlets may be additionally formed above the fourth layer outlet 184.

Figure 11:
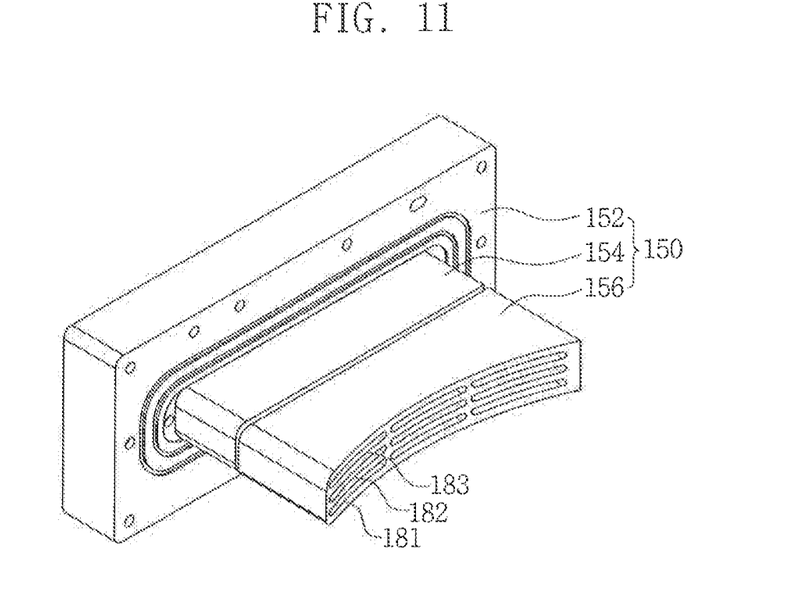
FIG. 11 is a perspective view of an injector according to an exemplary embodiment of the inventive concept.
Figure 12:
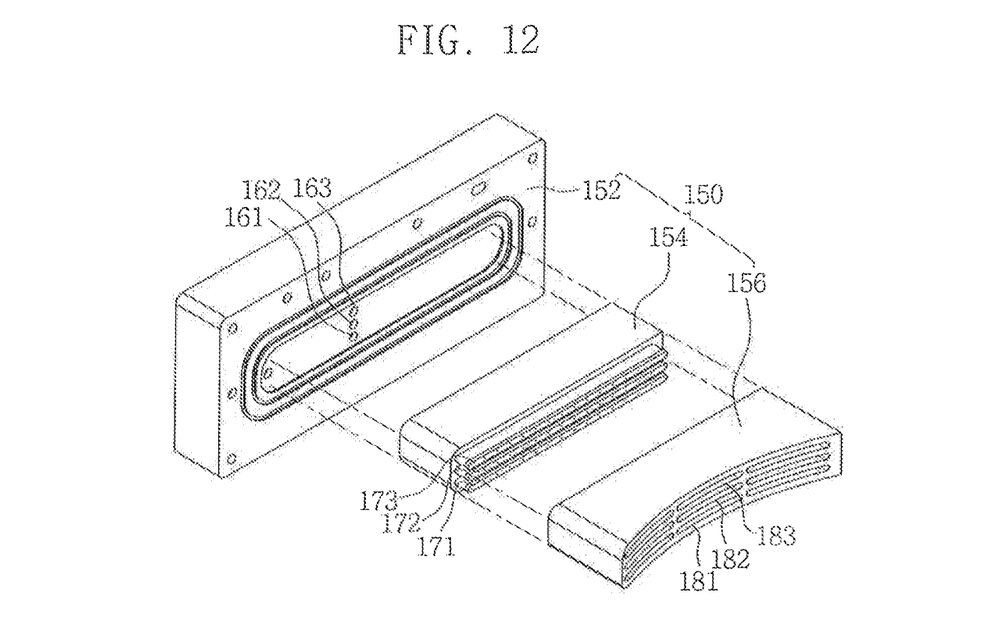
FIG. 12 is an exploded view of FIG. 11, according to an exemplary embodiment of the inventive concept.

FIG. 11 is a perspective view of an injector according to an exemplary embodiment of the inventive concept, and FIG. 12 is an exploded view of FIG. 11, according to an exemplary embodiment of the inventive concept.

Referring to FIGS. 11 and 12, an injector 150 may include a body 152, a first distributor 154, and a first guide 156. The body 152 may include a first gas inlet 161, a second gas inlet 162, and a third gas inlet 163.

The first distributor 154 may include a first layer distributor 171, a second layer distributor 172, and a third layer distributor 173. The first guide 156 may include a first layer outlet 181, a second layer outlet 182, and a third layer outlet 183.

Figure 13:
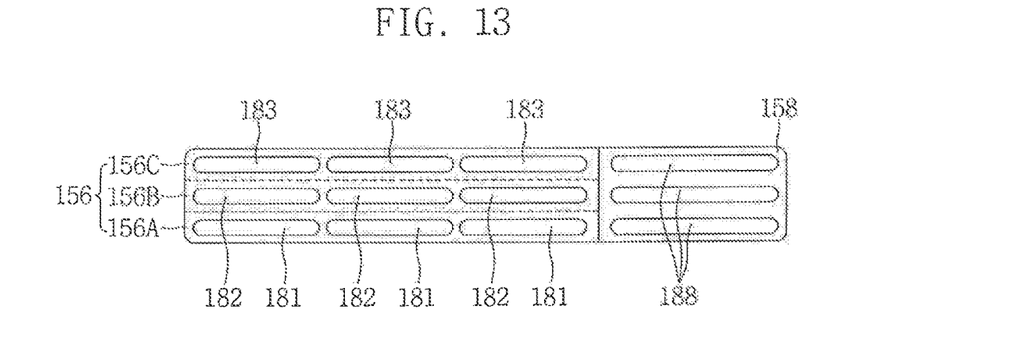
FIGS. 13, 14 and 15 are front views of injectors according to exemplary embodiments of the inventive concept.
Figure 14:
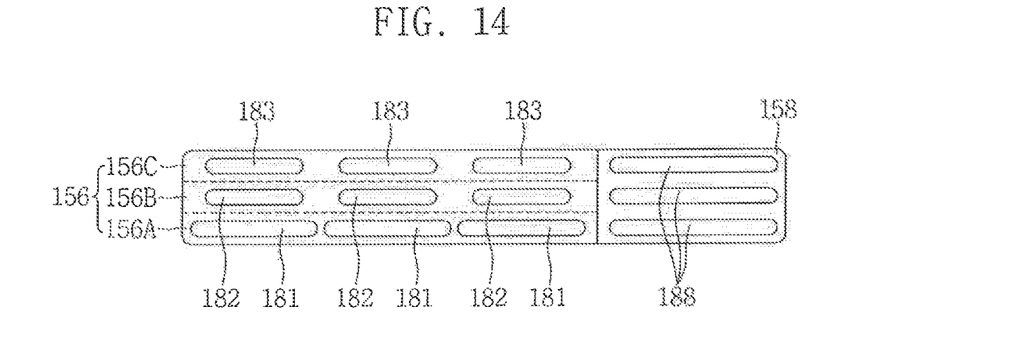
Figure 15:
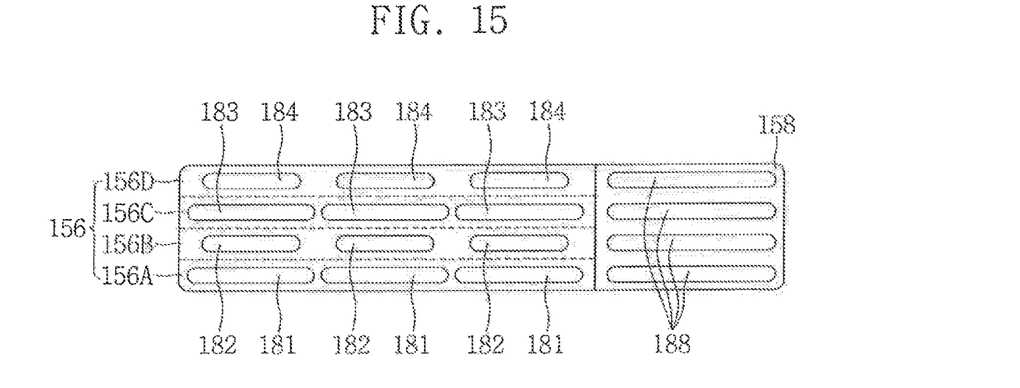

FIGS. 13 to 15 are front views for describing injectors according to exemplary embodiments of the inventive concept.

Referring to FIG. 13, a first guide 156 may include a first portion 156A, a second portion 156B, and a third portion 156C. A second guide 158 may include a curtain gas outlet 188. The first portion 156A, the second portion 156B, and the third portion 156C may have substantially the same horizontal width. The first portion 156A may include a first layer outlet 181. The second portion 156B may be formed at a higher level than the first portion 156A. The second portion 156B may include a second layer outlet 182. The third portion 156C may be formed at a higher level than the second portion 156B. The third portion 156C may include a third layer outlet 183. The first layer outlet 181, the second layer outlet 182, and the third layer outlet 183 may have substantially the same horizontal width.

Referring to FIG. 14, a first guide 156 may include a first portion 156A, a second portion 156B, and a third portion 156C. A second guide 158 may include a curtain gas outlet 188. The first portion 156A may include a first layer outlet 181. The second portion 156B may include a second layer outlet 182. The third portion 156C may include a third layer outlet 183. The second layer outlet 182 may have a smaller horizontal width than the first layer outlet 181. The third layer outlet 183 may have a smaller horizontal width than the first layer outlet 181. The third layer outlet 183 may have the same horizontal width as the second layer outlet 182.

Referring to FIG. 15, a first guide 156 may include a first portion 156A, a second portion 156B, a third portion 156C, and a fourth portion 156D. A second guide 158 may include a curtain gas outlet 188. The first portion 156A may include a first layer outlet 181. The second portion 156B may be formed at a higher level than the first portion 156A. The second portion 156B may include a second layer outlet 182. The third portion 156C may be formed at a higher level than the second portion 156B. The third portion 156C may include a third layer outlet 183. The fourth portion 156D may be formed at a higher level than the third portion 156C. The fourth portion 156D may include a fourth layer outlet 184.

The second layer outlet 182 may have a smaller horizontal width than the first layer outlet 181. The third layer outlet 183 may have substantially the same horizontal width as the first layer outlet 181. The fourth layer outlet 184 may have a smaller horizontal width than the third layer outlet 183. The fourth layer outlet 184 may have substantially the same horizontal width as the second layer outlet 182.

In an exemplary embodiment of the inventive concept, the first layer outlet 181, the second layer outlet 182, the third layer outlet 183, and the fourth layer outlet 184 may have substantially the same horizontal width.

In an exemplary embodiment of the inventive concept, the second layer outlet 182, the third layer outlet 183, and the fourth layer outlet 184 may have a smaller horizontal width than the first layer outlet 181.

Figure 16:
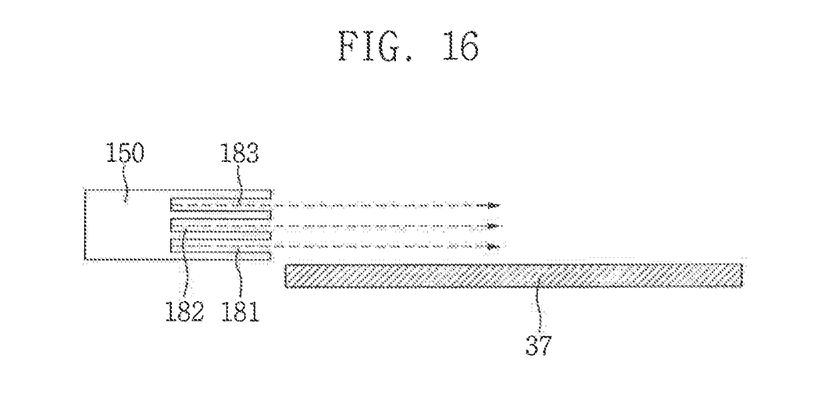
FIGS. 16, 17 and 18 are cross-sectionals views of injectors according to exemplary embodiments of the inventive concept.
Figure 17:
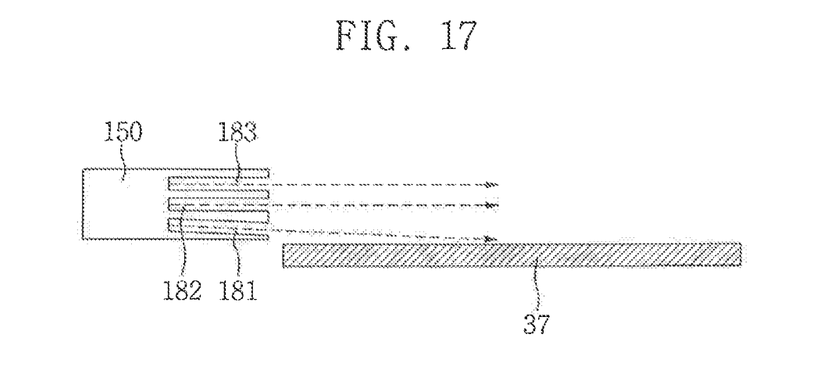
Figure 18:
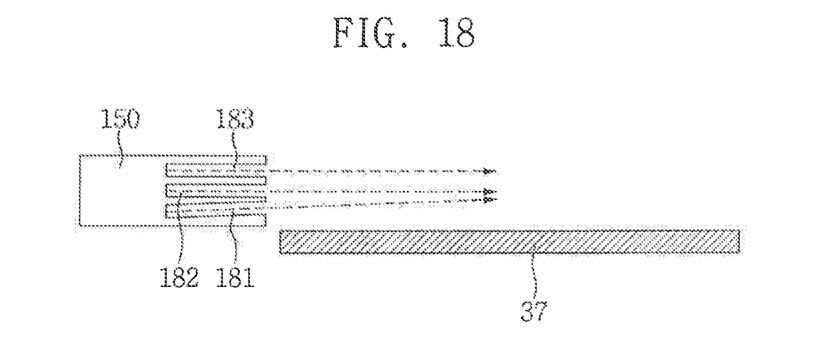

FIGS. 16 to 18 are cross-sectionals views of injectors according to exemplary embodiments of the inventive concept.

Referring to FIG. 16, a spray direction of a first carrier gas sprayed from a first layer outlet 181 may be parallel to a surface of a substrate 37. Spray directions of a first reactive gas sprayed from a second layer outlet 182 and a second reactive gas sprayed from a third layer outlet 183 may be parallel to the surface of the substrate 37. The first layer outlet 181 may be parallel to the surface of the substrate 37. The second layer outlet 182 and the third layer outlet 183 may be parallel to the surface of the substrate 37.

Referring to FIG. 17, a spray direction of a first carrier gas sprayed from a first layer outlet 181 may have a downward slope toward a surface of a substrate 37. The first carrier gas may be sprayed in a direction such that it gets closer to the surface of the substrate 37 as the first carrier gas gets farther away from the first layer outlet 181. The first layer outlet 181 may have a downward slope with respect to the surface of the substrate 37.

Referring to FIG. 18, a spray direction of a first carrier gas sprayed from a first layer outlet 181 may have an upward slope with respect to a surface of a substrate 37. The first carrier gas may be sprayed in a direction such that it gets farther away from the surface of the substrate 37 as the first carrier gas gets farther away from the first layer outlet 181. The first layer outlet 181 may have an upward slope with respect to the surface of the substrate 37.

Referring again to FIGS. 1 to 18, a method of forming a thin film according to an exemplary embodiment of the inventive concept will be described.

The substrate 37 may be loaded on the susceptor 25 inside the chamber 21. While the substrate 37 is loaded into or unloaded from the chamber 21 through the entrance 23, an inert gas or a first carrier gas may be discharged into the chamber 21 through the curtain gas inlet 168. The curtain gas supply device 48, the controller 33, the curtain gas inlet 168, the curtain gas distributor 178, and the curtain gas outlet 188 may be used to form a gas curtain. The susceptor 25 may rotate the substrate 37.

The first carrier gas and a first reactive gas may be supplied onto the substrate 37 through the injector 150. For example, the first layer outlet 181 may discharge the first carrier gas into the chamber 21. The second layer outlet 182 may discharge the first reactive gas into the chamber 21. The controller 33 may serve to control an amount and a speed of the first carrier gas discharged into the chamber 21 through the first layer outlet 181. For example, how far the first reactive gas travels from the first layer outlet 181 may be controlled by controlling the flow rate of the first carrier gas. A contact position of the first reactive gas and the substrate 37 may be controlled by the control of the amount and speed of the first carrier gas. For example, by controlling the amount and speed of the first carrier gas, the first reactive gas may be uniformly supplied onto a desired surface of the substrate 37.

In an exemplary embodiment of the inventive concept, the first layer outlet 181 may discharge the first carrier gas into the chamber 21. The second layer outlet 182 may discharge the first reactive gas into the chamber 21. The third layer outlet 183 may discharge a second reactive gas into the chamber 21.

In an exemplary embodiment of the inventive concept, the first layer outlet 181 may discharge the first carrier gas into the chamber 21. The second layer outlet 182 may discharge the first reactive gas into the chamber 21. The third layer outlet 183 may discharge a second carrier gas into the chamber 21. The fourth layer outlet 184 may discharge the second reactive gas into the chamber 21.

In an exemplary embodiment of the inventive concept, the first layer outlet 181 may discharge the first carrier gas into the chamber 21. The second layer outlet 182 may discharge the first reactive gas into the chamber 21. The third layer outlet 183 may discharge the second reactive gas into the chamber 21. The fourth layer outlet 184 may discharge a third reactive gas into the chamber 21.

The first carrier gas, the second carrier gas, the first reactive gas, the second reactive gas, the third reactive gas, and the inert gas may be discharged through the outlet 29.

Referring again to FIGS. 1 to 18, a method of forming a semiconductor device according to an exemplary embodiment of the inventive concept will be described.

A wafer may be loaded onto the susceptor 25 which is disposed inside the chamber 21. The inside of the chamber 21 may be heated and the susceptor 25 may be rotated. A film may be first formed on the wafer by outputting a reactive gas and a carrier gas from the injector 150 which is disposed at a sidewall of the chamber 21 to form a semiconductor device having a first layer, wherein the first layer is manufactured under a first condition. The injector 150 includes a first outlet 181 to output the carrier gas and a second outlet 182 to output the reactive gas, wherein the first outlet 181 is disposed below the second outlet 182.

The first layer of the semiconductor device may form a source or a drain.

The carrier gas may include H2 and the reactive gas may include at least one of DCS, HCl, GeH4 and B2H6.

The method may further include: changing the first condition to a second condition, rotating the susceptor 25, and second forming the film by outputting the reactive gas and the carrier gas using the injector 150 to form a second layer of the semiconductor device.

The method may further include: changing the second condition to a third condition, rotating the susceptor 25, and third forming the film using the reactive gas and the carrier gas using the injector 150 to form a third layer of the semiconductor device; removing the wafer from the chamber 21; and cleaning the chamber 21.

A flow rate of the reactive gas in the first forming may be different from a flow rate of the reactive gas in the second forming.

The first to third conditions may include pressure and temperature.

According an exemplary embodiment of the inventive concept, an injector having a first layer outlet and a second layer outlet is disposed on a sidewall of a chamber. The first layer outlet can discharge a carrier gas and the second layer outlet can discharge a reactive gas. An amount of flow and a flow rate of the carrier gas discharged through the first layer outlet can be controlled, and thus a transfer distance and the flow of the reactive gas can be controlled. The reactive gas can be uniformly supplied onto a substrate. Thus, a thin film can be uniformly formed on the substrate.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of forming a semiconductor device, comprising:
    loading a wafer onto a susceptor, wherein the susceptor is disposed inside a chamber;
    heating the inside of the chamber; and
    rotating the susceptor, and first forming a film on the wafer by outputting a reactive gas and a carrier gas from an injector disposed at a sidewall of the chamber to form a semiconductor device having a first layer, wherein the first layer is manufactured under a first condition,
    wherein the injector includes:
    a first outlet exposed within the chamber, the first outlet configured to discharge the carrier gas directly into the chamber; and
    a second outlet exposed within the chamber, the second outlet configured to discharge the reactive gas directly into the chamber,
    wherein the first outlet is disposed below the second outlet, and
    wherein the first forming the film comprises controlling a flow rate of the reactive gas by controlling a flow rate of the carrier gas.

2. The method of claim 1, wherein the first layer of the semiconductor device forms a source or a drain.

3. The method of claim 1, wherein the carrier gas includes H2 and the reactive gas includes at least one of DCS, HCl, GeH4 and B2H6.

4. The method of claim 1, further comprising:
    changing the first condition to a second condition, rotating the susceptor, and second forming the film by outputting the reactive gas and the carrier gas using the injector to form a second layer of the semiconductor device.

5. The method of claim 4, wherein the flow rate of the reactive gas in the first forming is different from a flow rate of the reactive gas in the second forming.

6. The method of claim 4, further comprising:
    changing the second condition to a third condition, rotating the susceptor, and third forming the film using the reactive gas and the carrier gas using the injector to form a third layer of the semiconductor device;
    removing the wafer from the chamber; and
    cleaning the chamber.

7. The method of claim 6, wherein the first to third conditions include pressure and temperature.

* * * * *